(12) United States Patent
Kang et al.

(10) Patent No.: US 10,032,408 B2
(45) Date of Patent: Jul. 24, 2018

(54) PIXEL CIRCUIT AND ORGANIC LIGHT EMITTING DISPLAY DEVICE HAVING THE SAME

(71) Applicant: SAMSUNG DISPLAY CO., LTD., Yongin-si, Gyeonggi-do (KR)

(72) Inventors: Byeong-Doo Kang, Cheonan-si (KR); Jong-Hwa Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 114 days.

(21) Appl. No.: 15/089,075

(22) Filed: Apr. 1, 2016

(65) Prior Publication Data

US 2017/0124939 A1 May 4, 2017

(30) Foreign Application Priority Data

Oct. 28, 2015 (KR) ........................ 10-2015-0150446

(51) Int. Cl.
*G09G 3/3208* (2016.01)
*H01L 27/32* (2006.01)
*H01L 27/12* (2006.01)

(52) U.S. Cl.
CPC ....... *G09G 3/3208* (2013.01); *H01L 27/3262* (2013.01); *H01L 27/3265* (2013.01); *H01L 27/3276* (2013.01); *G09G 2320/0233* (2013.01); *H01L 27/124* (2013.01); *H01L 27/1255* (2013.01)

(58) Field of Classification Search
CPC ............. G09G 3/3208; H01L 27/3262; H01L 27/3265
See application file for complete search history.

(56) References Cited

U.S. PATENT DOCUMENTS 8,982,017 B2 * 3/2015 Lee ...................... G09G 3/3225
315/169.3
2017/0018224 A1 * 1/2017 Lee ...................... G09G 3/3233

FOREIGN PATENT DOCUMENTS

KR 10-2013-0026338 A 3/2013

* cited by examiner

*Primary Examiner* — Kent Chang
*Assistant Examiner* — Scott Au
(74) *Attorney, Agent, or Firm* — Lewis Roca Rothgerber Christie LLP

(57) ABSTRACT

A pixel circuit includes a scan transistor connected between a data line and a first node and being configured to receive a scan signal, an emission control transistor connected between a first power supply and a second node and being configured to receive an emission control signal, a driving transistor connected between the second node and a third node and being connected to the first node, an initialize transistor being configured to receive an initialization signal, a storage capacitor connected between the first node and the third node; an organic light emitting diode connected between the third node and a second power supply, a charge share capacitor connected between a fourth node and the second power supply; and a charge share transistor configured to connect the charge share capacitor to the storage capacitor, the charge share transistor being configured to receive a charge share control signal.

19 Claims, 10 Drawing Sheets

PIXEL CIRCUIT AND ORGANIC LIGHT EMITTING DISPLAY DEVICE HAVING THE SAME

CROSS REFERENCE TO RELATED APPLICATION

This application claims priority to and the benefit of Korean Patent Application No. 10-2015-0150446, filed on Oct. 28, 2015 in the Korean Intellectual Property Office (KIPO), the disclosure of which is hereby incorporated by reference herein in its entirety.

BACKGROUND

1. Field

Aspects of the inventive concept relate to display devices.

2. Description of the Related Art

A pixel circuit emits light based on a data voltage and includes transistors, such as thin film transistors (TFTs), for controlling the emission. The transistors may be classified as amorphous silicon TFTs, poly-silicon TFTs, oxide TFTs, and/or the like, based on the materials used. The oxide TFTs have high electron mobility and low current such that a display device having low power consumption can be implemented.

The data signals applied to the pixel circuit experience voltage drops or losses due to parasitic components (e.g., parasitic capacitances of organic light emitting diode) such that a source voltage of a driving transistor of the pixel circuit is unintentionally changed. In addition, the parasitic capacitances are different from each other such that a luminance difference in a display panel is perceived. Accordingly, an image uniformity (and a luminance uniformity) of the display panel decreases.

SUMMARY

Aspects of embodiments of the present invention are directed to a pixel circuit including a charge sharing capacitor that shares electric charges with a storage capacitor to reduce luminance difference.

Aspects of embodiments of the present invention are directed to an organic light emitting display device having the pixel circuit.

According to some example embodiments of the present invention, there is provided a pixel circuit including: a scan transistor connected between a data line and a first node and having a gate electrode configured to receive a scan signal; an emission control transistor connected between a first power supply and a second node and having a gate electrode configured to receive an emission control signal; a driving transistor connected between the second node and a third node and having a gate electrode connected to the first node; an initialize transistor connected between an initialization voltage supply and the third node and having a gate electrode configured to receive an initialization signal; a storage capacitor connected between the first node and the third node; an organic light emitting diode connected between the third node and a second power supply, a voltage of the second power supply being less than that of the first power supply; a charge share capacitor connected between a fourth node and the second power supply; and a charge share transistor connected between the third node and the fourth node and configured to connect the charge share capacitor to the storage capacitor, the charge share transistor having a gate electrode configured to receive a charge share control signal.

In an embodiment, the storage capacitor and the charge share capacitor are electrically connected in series with each other when the charge share transistor is turned on.

In an embodiment, a capacitance of the charge share capacitor is greater than a parasitic capacitance of the organic light emitting diode.

In an embodiment, the capacitance of the charge share capacitor is less than or equal to a capacitance of the storage capacitor.

In an embodiment, each of an initialization period, a compensation period after the initialization period, a writing period after the compensation period, and an emission period after the writing period is defined as a frame period, wherein the scan transistor and the charge share transistor are configured to be turned on during the writing period, and wherein the organic light emitting diode is configured to emit light during the emission period.

In an embodiment, the charge share capacitor shares electric charges stored at the storage capacitor during the writing period.

In an embodiment, the charge share transistor is configured to be turned on following the scan transistor being turned on in the writing period.

In an embodiment, the charge share transistor is configured to maintain a turned-on state during the initialization period and the compensation period.

In an embodiment, the charge share control signal corresponds to the scan signal.

In an embodiment, the charge share transistor and the scan transistor are configured to be concurrently turned on.

In an embodiment, a voltage of the initialization voltage supply is less than or equal to a threshold voltage of the organic light emitting diode.

According to some example embodiments of the present invention, there is provided an organic light emitting display device including: a display panel including a plurality of pixel circuits each including a storage capacitor and a charge share capacitor; a data driver configured to provide data signals to the display panel; a scan driver configured to provide a plurality of scan signals, an initialization signal, an emission control signal, and an charge share control signal to the display panel; a power supply configured to provide a first power supply voltage, a second power supply voltage less than the first power voltage, and an initialization voltage to the display panel; and a timing controller configured to control the data driver and the scan driver, wherein each of the pixel circuits is configured to electrically connect the storage capacitor to the charge share capacitor during a writing period.

In an embodiment, each of the pixel circuits further includes: a scan transistor connected between a data line and a first node and having a gate electrode configured to receive a respective scan signal of the scan signals; an emission control transistor connected between a line supplying the first power supply voltage and a second node, and having a gate electrode configured to receive the emission control signal; a driving transistor connected between the second node and a third node and having a gate electrode connected to the first node; an initialize transistor connected between a line supplying the initialization voltage and the third node, and having a gate electrode configured to receive the initialization signal; an organic light emitting diode connected between the third node and a line supplying the second power supply voltage; and a charge share transistor connected between the third node and a fourth node and configured to connect the charge share capacitor to the storage capacitor, the charge share transistor having a gate electrode configured to receive the charge share control signal, wherein the storage capacitor is connected between the first node and the third node, and wherein the charge share capacitor is connected between the fourth node and the line supplying the second power supply voltage.

In an embodiment, each of an initialization period, a compensation period after the initialization period, a writing period after the compensation period, and an emission period after the writing period is defined as a frame period, wherein the scan transistor and the charge share transistor are configured to be turned on during the writing period, and wherein the organic light emitting diode is configured to emit light during the emission period.

In an embodiment, the scan driver is configured to sequentially activate the scan signals row by row in the writing period.

In an embodiment, the charge share control signal corresponds to the scan signals.

In an embodiment, the scan driver includes: an initialization driver configured to concurrently provide the initialization signal that is activated to the pixel circuits during the initialization period; and an emission driver configured to concurrently provide the emission control signal that is activated to the pixel circuits during the compensation period and the emission period.

In an embodiment, the scan driver further includes: a charge share driver configured to concurrently provide the charge share control signal that is activated according to the scans signals to the pixel circuits.

In an embodiment, the charge share transistor is configured to turn on following the scan transistor being turned on in the writing period.

In an embodiment, the charge share transistor is configured to maintain a turned-on state during the initialization period and the compensation period.

Therefore, the pixel circuit according to example embodiments may include the charge share transistor and the charge share capacitor, which are electrically connected to the storage capacitor in series, so that a voltage drop of the source voltage of the driving transistor due to the capacitive coupling between the parasitic capacitor and the storage capacitor may be reduced or eliminated. Thus, the luminance decrease and luminance difference may be reduced or eliminated.

In addition, the organic light emitting display device according to example embodiments may include the pixel circuits, such that the luminance decrease of the display panel may be reduced or eliminated, and thus, the luminance uniformity and image uniformity may be improved (e.g., increased).

BRIEF DESCRIPTION OF THE DRAWINGS

Example embodiments can be understood in more detail from the following description taken in conjunction with the accompanying drawings, in which.

DETAILED DESCRIPTION

Exemplary embodiments will be described more fully hereinafter with reference to the accompanying drawings, in which various embodiments are shown.

Figure 1:
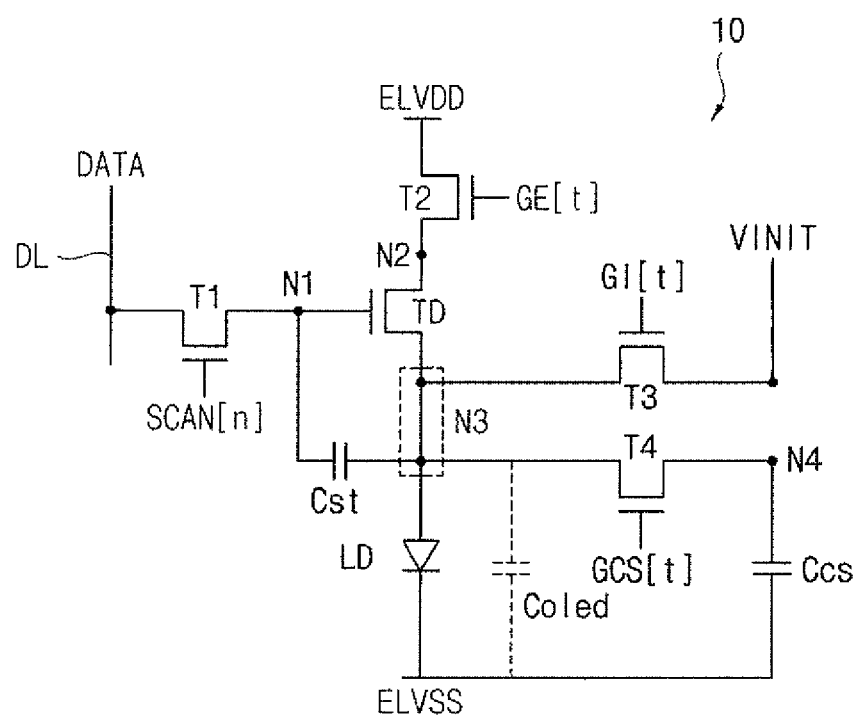
FIG. 1 is a circuit diagram of a pixel circuit according to example embodiments of the present invention.

FIG. 1 is a circuit diagram of a pixel circuit according to example embodiments of the present invention.

Referring to FIG. 1, the pixel circuit 10 may include a scan transistor T1, an emission control transistor T2, a driving transistor TD, an initialize transistor T3, a storage capacitor Cst, a charge share capacitor Ccs, a charge share transistor T4, and an organic light emitting diode LD.

In some embodiments, the pixel circuit 10 may correspond to a pixel circuit driven by a simultaneous (or concurrent) emission method.

The scan transistor T1 may be connected between a data line DL and a first node N1, and a gate electrode of the scan transistor T1 may receive a scan signal SCAN[n]. The emission control transistor T2 may be connected between a first power supply voltage ELVDD and a second node N2, and a gate electrode of the emission control transistor T2 may receive an emission control signal GE[t]. The driving transistor TD may be connected between the second node N2 and a third node N3, and a gate electrode of the driving transistor TD may be connected to the first node N1. The initialize transistor T3 may be connected between an initialization voltage VINIT and the third node N3, and a gate electrode of the initialization transistor T3 may receive an initialization signal GI[t]. The storage capacitor Cst may be connected between the first node N1 and the second node N2. The charge share capacitor Ccs may be connected between a fourth node N4 and the second node N2. The charge share transistor T4 may be connected between the third node N3 and the fourth node N4, and a gate electrode of the charge share transistor T4 may receive a charge share control signal GCS[t]. The charge share transistor T4 may electrically connect the charge share capacitor Ccs to the storage capacitor Cst based on the charge share control signal GCS[t]. Here, a parasitic capacitor Coled, which is a parasitic element, may be included in (e.g., exhibited by) the organic light emitting diode LD. A data voltage DATA applied to the gate electrode of the driving transistor TD (or the first node N1) may be distributed and charged (or stored) at the storage capacitor Cst and the charge share capacitor Ccs. Thus, a voltage loss (charged or stored at the storage capacitor Cst) may occur as a result of the parasitic capacitor Coled.

FIG. 1 illustrates an embodiment of using n-channel metal-oxide semiconductor (NMOS) transistors. For example, the signals applied to the gate electrodes of the NMOS transistors are activated with a logical high level. In some examples, some transistors may be replaced with p-channel metal-oxide semiconductor (PMOS) transistors and the signals applied to the gate electrodes of the PMOS transistors may be activated with a logical low level.

When the scan signal SCAN[n] is activated with a logical high level, the scan transistor T1 may be turned on and the data voltage DATA on the data line DL may be applied to the first node N1. The driving transistor TD may be turned on or turned off based on the data voltage DATA.

When the emission control signal EM is activated with the logical high level, the emission control transistor T2 may be turned on and a driving current may be provided to the organic light emitting diode LD depending on the data voltage DATA. The emission of the organic light emitting diode LD and luminance may be determined by the driving current. In one embodiment, when the scan signal SCAN[n] and the emission control signal GE[t] are activate with the logical high level, the scan transistor T1 and the emission control transistor T2 may be turned on, a sustain voltage may be applied to the gate electrode of the driving transistor through the data line DL, and a threshold voltage of the driving transistor TD may be compensated. Here, the sustain voltage may be provided to the data line in a certain period, except for a writing period in which the data voltage DATA is written at the data driver TD. The sustain voltage may be a voltage to maintain the stable gate voltage of the driving transistor TD in a non-emission period of a frame.

The initialization signal GI[t] is activated with the logical high level, the initialize transistor T3 may be turned on and the third node N3 may be initialized to have the initialization voltage VINIT. Here, the third node may correspond to an anode of the organic light emitting diode LD. The initialization voltage VINIT may initialize a residue of voltage at the organic light emitting diode LD. The initialization voltage VINIT may be set at a sufficiently low voltage, considering a threshold voltage of the organic light emitting diode LD. In one embodiment, the initialization voltage VINIT may be less than or equal to the threshold voltage of the organic light emitting diode LD.

When the charge share control signal GCS[t] is activated with the logical high level, the charge share transistor T4 may be turned on and the storage capacitor Cst and the charge share capacitor Ccs may be connected in series with each other. The parasitic capacitors Coled of the pixels may have different capacitances based on material characteristics of the corresponding organic light emitting diodes LD. Thus, although the same data voltage DATA is applied to a plurality of pixel circuits, the luminance difference of the pixel circuits may occur. When the storage capacitor Cst and the charge share capacitor Ccs may be connected in series, electric charge sharing may occur between the storage capacitor Cst and the charge share capacitor Ccs (including the parasitic capacitor Coled connected in parallel with the charge share capacitor Ccs). Thus, a capacitive coupling by the parasitic capacitor Coled may decrease such that a voltage drop at the driving transistor TD may be reduced. Here, as the capacitance of the charge share capacitor Ccs increases, the capacitive coupling by the parasitic capacitor Coled may decrease. In one embodiment, the capacitance of the charge share capacitor Ccs may be greater than the capacitance of the parasitic capacitor Coled. In one embodiment, the capacitance of the charge share capacitor Ccs may be greater than the capacitance of the parasitic capacitor Coled and less than or equal to the capacitance of the storage capacitor Cst. However, these are mere examples, and sizes (or the capacitance) of the charge share capacitor Ccs may be designed depending on conditions of the pixel circuits.

Figure 2:
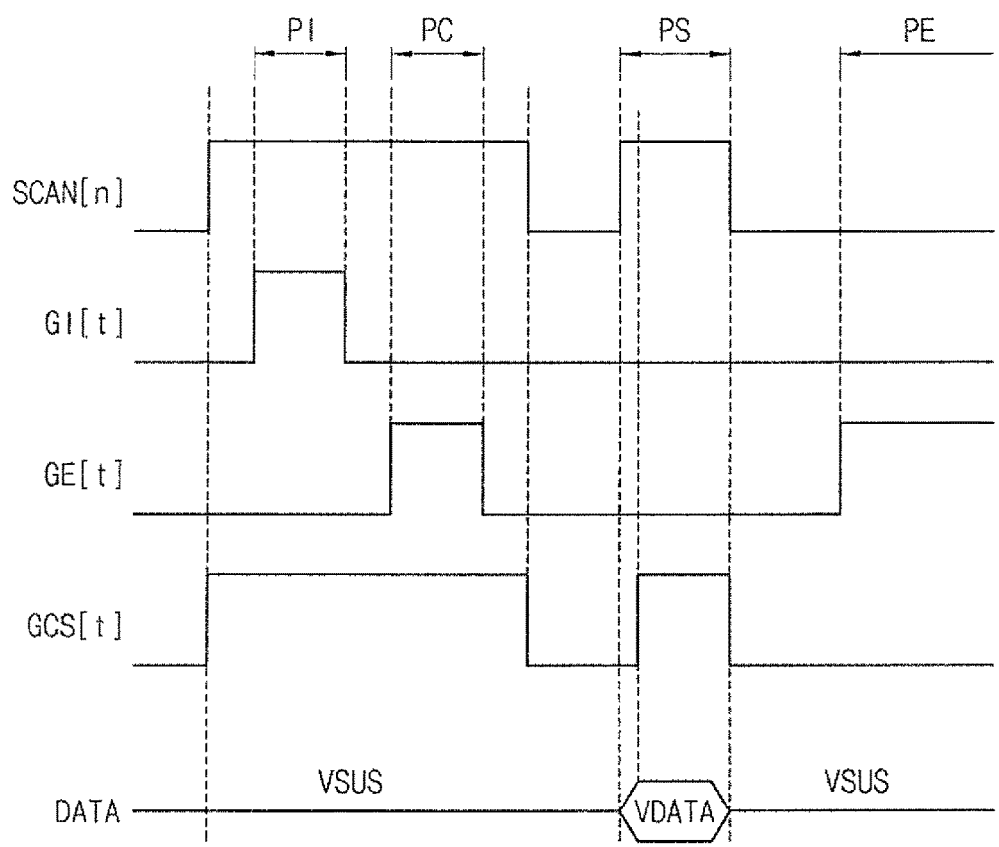
FIG. 2 is a timing diagram illustrating an example of an operation of the pixel circuit of FIG. 1.

FIG. 2 is a timing diagram illustrating an example of an operation of the pixel circuit of FIG. 1.

Referring to FIGS. 1 and 2, each frame period may include an initialization period PI, a compensation period PC after the initialization period PI, a writing period PS after the compensation period PC, and an emission period PE after the writing period PS. The scan transistor T1 and the charge share transistor T4 may be turned on during the writing period PS. The organic light emitting diode LD may emit light during the emission period PE.

In one embodiment, the pixel circuit 10 may be driven by the simultaneous (or concurrent) emission method. Thus, the emission period PE may be started after the writing period PS with respect to all pixel rows elapsed.

The initialization signal GI[t] may be activated with the logical high level in the initialization period PI, and the emission control signal GE[t] may be activated with the logical high level in the compensation period PC. Here, the scan signal SCAN[n] and the charge share control signal GCS[t] may maintain the logical high level during the initialization period PI and the compensation period PC. The scan signal SCAN[n] may be activated with the logical high level in the writing period PS and the charge share control signal GCS[t] may be activated with the logical high level after the scan signal SCAN[n] activated. The emission control signal GE[t] may be activated with the logical high level in the emission period PE. In one embodiment, the initialization signal GI[t], the emission control signal GE[t], and the charge share control signal GCS[t] may be global signals each concurrently activated with respect to all pixel rows. The data voltage DATA may be applied to the data line DL during the writing period PS and the sustain voltage VSUS may be applied to the data line DL during the frame period, except for the writing period PS.

Hereinafter, the operation of the pixel circuit 10 is further described with reference to FIGS. 1 and 2.

The entire operations of the pixel circuit 10 may be divided into the initialization period PI, the compensation period PC, the writing period PS, and the emission period PE.

The scan signal SCAN[n], the charge share control signal GCS[t], and the initialization signal GI[t] may have the logical high level during the initialization period PI such that the scan transistor T1, the initialize transistor T3, and the charge share transistor T4 may be turned on in the initialization period PI. Also the emission control signal GE[t] may be deactivated with a logical low level during the initialization period PI such that the emission control transistor T2 and the driving transistor TD may be turned off in the initialization period PI. As a result, the sustain voltage VSUS may be applied to the first node N1 during the initialization period PI and the initialization voltage VINIT may be applied to the third node N3 during the initialization period PI. Here, the initialization voltage VINIT may initialize a residue of voltage at the organic light emitting diode LD. In one embodiment, the initialization voltage VINIT may be less than or equal to the threshold voltage of the organic light emitting diode LD. Thus, a voltage of the anode of the organic light emitting diode LD may be initialized.

The scan signal SCAN[n], the charge share control signal GCS[t], and the emission control signal GE[t] may have the logical high level during the compensation period PC such that the scan transistor T1 and the charge share transistor T4 may maintain a turned-on state and the emission control transistor T2 may be turned on in the compensation period PC. Also the initialization signal GI[t] may be deactivated with the logical low level during the compensation period PC such that the initialize transistor T3 and the driving transistor TD may be turned off in the compensation period PC. Thus, the sustain voltage VSUS may be applied to the first node N1, the first power supply voltage ELVDD may be applied to the second node N2, and a voltage (VSUS−VTH), equal to the sustain voltage VSUS subtracted by the threshold voltage VTH of the driving transistor TD, may be applied to the third node N3. Here, the charge share control signal GCS[t] maintains the logical high level during the initialization period PI and the compensation period PC such that the voltage (VSUS−VTH) may be maintained at the fourth node.

The initialization signal GI[t] and the emission control signal GE[t] may have the logical low level during the writing period PS such that the initialization transistor T3, the emission control transistor T2, and the driving transistor TD may be turned off in the writing period PS. The scan signal SCAN[n] and the charge share control signal GCS[t] may be activated with the logical high level during the writing period PS such that the scan transistor T1 and the charge share transistor T4 may be turned on in the writing period PS. Here, the data voltage VDATA may be applied to first node N1 via the data line DL. In one embodiment, the charge share control signal GCS[t] may be activated with the logical high level after the scan signal SCAN[n] is activated. Here, the charge share transistor T4 may be turned on following the scan transistor T1 being turned on. Thus, the data voltage VDATA may be stably provided to the first node N1. In addition, the charge share transistor T4 is turned on such that the storage capacitor Cst and the charge share Ccs may be electrically connected in series with each other and the storage capacitor Cst and the charge share capacitor Ccs may share the electric charges.

A voltage at the third node N3 may be changed by (or may fluctuate as a result of) the capacitive coupling of the storage capacitor Cst when the data voltage VDATA is applied. The storage capacitor Cst is connected to the charge share capacitor Ccs in series such that the charge sharing may occur between the storage capacitor Cst and the charge share capacitor Ccs. Thus, the voltage at the third node N3 (e.g., a source voltage of the driving transistor TD) may be expressed by Equation 1.

$$VN3=(VSUS-VTH+a*(VDATA-VSUS)) \quad \text{Equation 1}$$

In Equation 1, VN3 represents the voltage at the third node, VSUS represents the sustain voltage, VTH represents the threshold voltage of the driving transistor TD, and VDATA represents the data voltage applied to the first node N1. In Equation 1, "a" represents a coefficient determined by a capacitance ratio of the storage capacitor Cst, the parasitic capacitor Coled, and the charge share capacitor Ccs. Here, the capacitances of pixel circuits may be different such that the coefficient "a" with respect to the pixel circuits may be different. Accordingly, the pixel circuits may have different luminance with respect to the same data voltage VDATA such that the luminance difference may be shown. Therefore, it is necessary to reduce (or minimizing) the coefficient "a" to remove (or reduce) the luminance difference. For example, the coefficient "a" may be proportional to a ratio of an equivalent capacitance (i.e., COLED+CCS) of the parasitic capacitor Coled and the charge share capacitor Ccs to the capacitance of the storage capacitor Cst. The coefficient "a" may be expressed by Equation 2.

$$a=b*(CST/(CST+COLED+CCS)) \quad \text{Equation 2}$$

In Equation 2, "b" represents a constant value for determining the coefficient "a", CST represents the capacitance of the storage capacitor Cst, COLED represents the capacitance of the parasitic capacitor Coled, and CCS represents the capacitance of the charge share capacitor Ccs. The capacitance CCS of the charge share capacitor Ccs may be determined to reduce the coefficient "a". As the capacitance CCS of the charge share capacitor Ccs increases, the coefficient "a" may decrease. In one embodiment, the capacitance CCS of the charge share capacitor Ccs may be greater than the capacitance COLED of the parasitic capacitor Coled. However, the capacitance CCS of the charge share capacitor Ccs may be less than or equal to the capacitance CST of the storage capacitor Cst due to limitations of the pixel circuit design (e.g., a space restriction).

A current ITD flowing through the driving transistor TD may be expressed by Equation 3.

$$\begin{aligned} ITD &= K*(VDATA-VN3-VTH)^2 \\ &= K*(VDATA-(VSUS-VTH+ \\ & \quad a*(VDATA-VSUS))-VTH)^2 \\ &= K*(1-a)^2*(VDATA-VSUS)^2 \end{aligned} \quad \text{Equation 3}$$

In Equation 3, K represents a constant value for determining physical characteristics of the driving transistor TD. According to Equation 3, when the coefficient "a" is reduced, a difference of the current ITD of the driving transistor TD, a luminance decrease, and the luminance difference may be reduced.

Meanwhile, a voltage for emitting may be charged (or stored) at the storage capacitor based on a voltage difference between the voltage at the first node N1 (i.e., a gate voltage of the driving transistor TD) and the voltage VN3 at the third node N3 (i.e., the source voltage of the driving transistor TD).

The scan signal SCAN[n], the initialization signal GI[t], and the charge share control signal GCS[t] may be deactivated with the logical low level during the emission period PE such that the scan transistor T1, the initialization transistor T3, and the charge share control transistor T4 may be turned off. The emission control signal GE[t] may be activated with the logical high level to turn on the emission control transistor T2 during the emission period PE. The organic light emitting diode LD may emit light based on the voltage charged (or stored) at the storage capacitor Cst during the emission period PE.

As described above, the pixel circuit 10 may include the charge share transistor T4 and the charge share capacitor Ccs electrically connected to the storage capacitor Cst in series, so that a voltage drop of the source voltage of the driving transistor TD due to the capacitive coupling between the parasitic capacitor Coled and the storage capacitor Cst may be reduced or eliminated. Thus, the luminance decrease and luminance difference may be reduced or eliminated.

Figure 3:
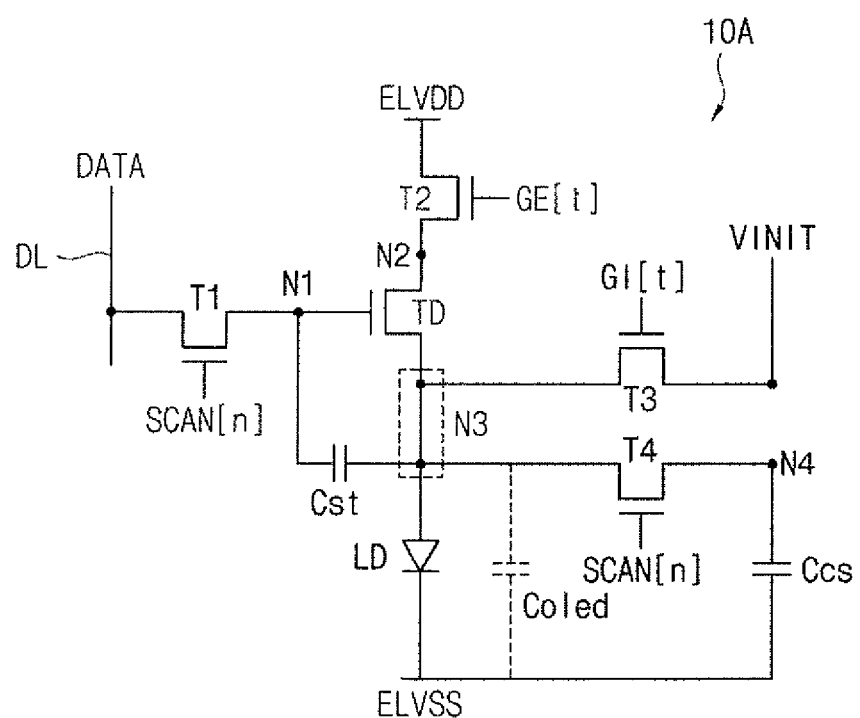
FIG. 3 is a circuit diagram illustrating an example of the pixel circuit of FIG. 1.
Figure 4:
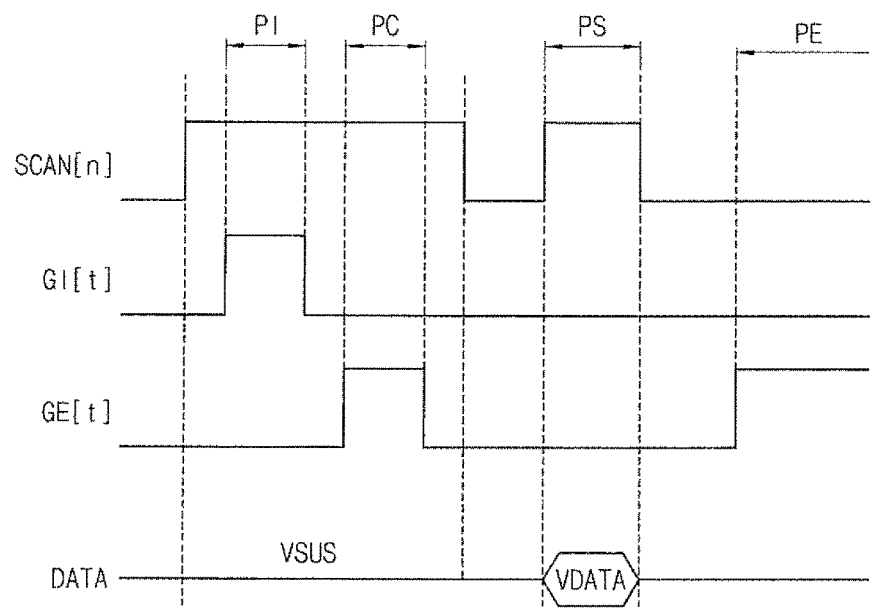
FIG. 4 is a timing diagram illustrating an example of an operation of the pixel circuit of FIG. 3.

FIG. 3 is a circuit diagram illustrating an example of the pixel circuit of FIG. 1. FIG. 4 is a timing diagram illustrating an example of an operation of the pixel circuit of FIG. 3.

In FIGS. 3 and 4, like reference numerals are used to designate elements of the pixel circuit that are the same as those in FIGS. 1 and 2, and detailed description of these elements may not be repeated. The pixel circuit of FIG. 3 may be substantially the same as or similar to the pixel circuit of FIG. 1, except for a signal provided to the charge share transistor T4.

Referring to FIGS. 3 and 4, the pixel circuit 10A may include a scan transistor T1, an emission control transistor T2, a driving transistor TD, an initialize transistor T3, a storage capacitor Cst, a charge share capacitor Ccs, a charge share transistor T4, and an organic light emitting diode LD. Each frame period may include an initialization period PI, a compensation period PC after the initialization period PI, a writing period PS after the compensation period PC, and an emission period PE after the writing period PS.

In some embodiments, the pixel circuit 10A may correspond to a pixel circuit driven by a simultaneous (or concurrent) emission method.

The scan transistor T1 may be connected between a data line DL and a first node N1, and a gate electrode of the scan transistor T1 may receive a scan signal SCAN[n]. The emission control transistor T2 may be connected between a first power supply voltage ELVDD and a second node N2, and a gate electrode of the emission control transistor T2 may receive an emission control signal GE[t]. The driving transistor TD may be connected between the second node N2 and a third node N3, and a gate electrode of the driving transistor TD may be connected to the first node N1. The initialize transistor T3 may be connected between an initialization voltage VINIT and the third node N3, and a gate electrode of the initialization transistor T3 may receive an initialization signal GI[t]. The storage capacitor Cst may be connected between the first node N1 and the second node N2. The charge share capacitor Ccs may be connected between a fourth node N4 and the second node N22. The charge share transistor T4 may be connected between the third node N3 and the fourth node N4, and a gate electrode of the charge share transistor T4 may receive the scan signal SCAN[n]. The charge share transistor T4 may electrically connect the charge share capacitor Ccs to the storage capacitor Cst based on the scan signal SCAN[n]. Here, a parasitic capacitor Coled, which is a parasitic element, may be included in the organic light emitting diode LD. In the embodiment of FIGS. 3 and 4, the scan signal SCAN[n], instead of the charge share control signal of FIG. 1, may be provided to the gate electrode of the charge share transistor T4. Thus, the charge share transistor T4 and the scan transistor T1 may be turned on or off concurrently.

The initialization signal GI[t] may be activated with the logical high level in the initialization period PI and deactivated with the logical low level in the compensation period PC. Here, the scan signal SCAN[n] may maintain the logical high level during the initialization period PI and the compensation period PC. The scan signal SCAN[n] may be activated with the logical high level in the writing period PS. The emission control signal GE[t] may be activated with the logical high level in the emission period PE. In one embodiment, the initialization signal GI[t] and emission control signal GE[t] may be global signals each concurrently activated with respect to all pixel rows. The data voltage DATA may be applied to the data line DL during the writing period PS and the sustain voltage VSUS may be applied to the data line DL during the frame period, except for the writing period PS.

Because operations of the pixel circuit 10A are described above with reference to FIGS. 1 and 2, duplicated descriptions will not be repeated.

Accordingly, the pixel circuit 10A may include the charge share transistor T4 and the charge share capacitor Ccs electrically connected to the storage capacitor Cst in series, so that a voltage drop of the source voltage of the driving transistor TD due to the capacitive coupling between the parasitic capacitor Coled and the storage capacitor Cst may be reduced or eliminated. Thus, the luminance decrease and luminance difference may be reduced or eliminated. In addition, the scan signal SCAN[n] is applied to the charge share transistor T4 such that circuit constitutions for generating a charge share control of FIGS. 1 and 2 may be omitted (or may not be used). Thus, constitutions of a scan driver and/or a power supply may be simplified.

Figure 5:
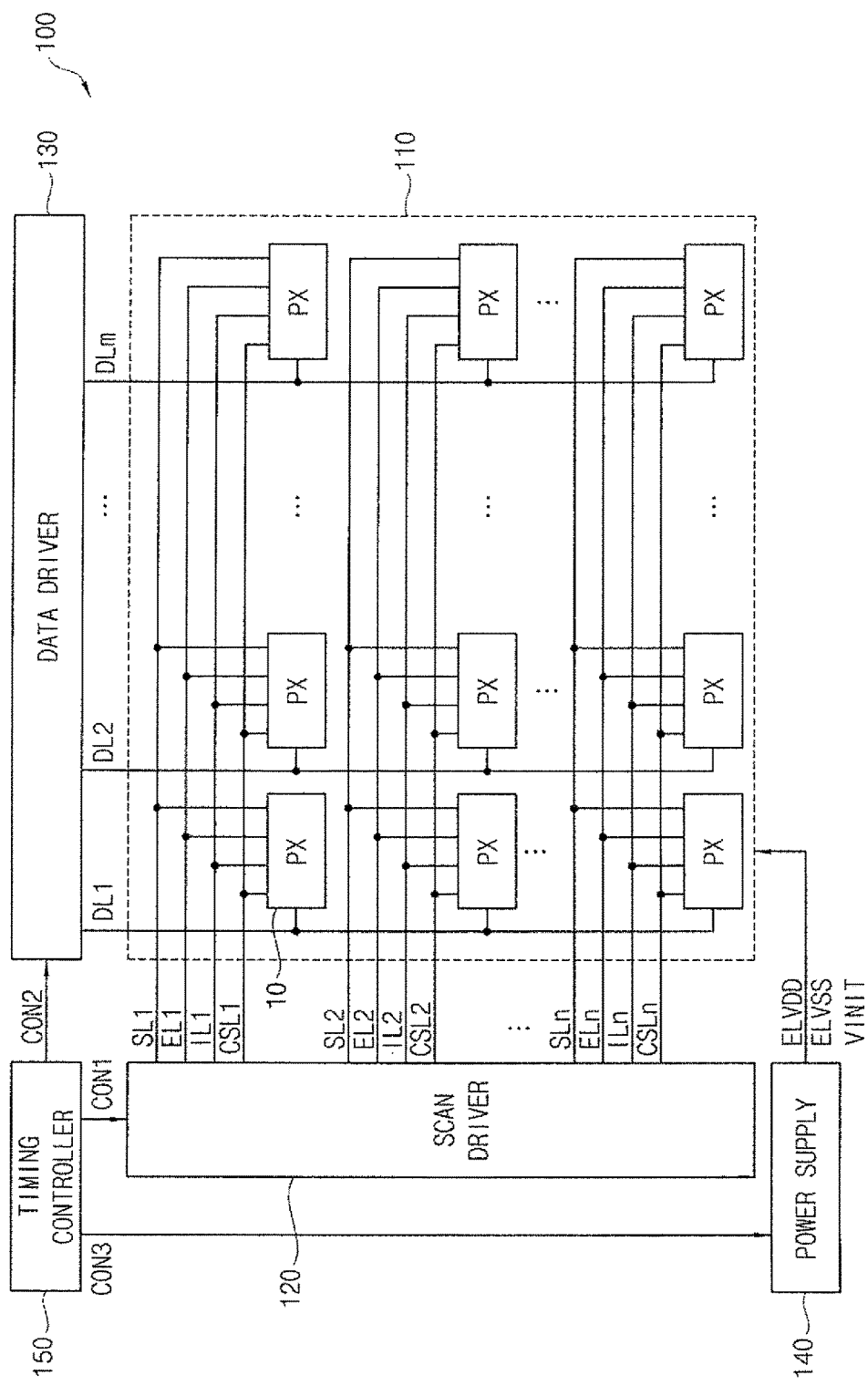
FIG. 5 is a block diagram of an organic light emitting display device according to example embodiments of the present invention.

FIG. 5 is a block diagram of an organic light emitting display device according to example embodiments of the present invention.

Referring to FIG. 5, the organic light emitting display device 100 may include a display panel 110, a scan driver 120, a data driver 130, a power supply 140, and a timing controller 150. The organic light emitting display device 100 may further include a buffer for storing image data to be displayed, and/or the like.

The display panel 110 may include a plurality of pixel circuits 10. For example, as illustrated in FIG. 5, the pixel circuits 10 may be arranged in a matrix form of n rows and m columns. The display panel 110 may be coupled to the data driver 130 through a plurality of data lines DL1 to DLm, and may be coupled to the scan driver 120 through a plurality of row control lines. In one embodiment, the row control lines may include a plurality of scan lines SL1 to SLn, a plurality of emission control lines EL1 to ELn, initialization lines IL1 to ILn, and charge share control lines CSL1 to CSLn.

As described above with reference to FIGS. 1 and 2, each of the pixel circuits 10 may electrically connect the storage capacitor Cst to the charge share capacitor Ccs during the writing period PS. In one embodiment, each of the pixel circuits 10 may include the scan transistor T1, the emission control transistor T2, the driving transistor TD, the initialize transistor T3, the storage capacitor Cst, the charge share capacitor Ccs, the charge share transistor T4, and the organic light emitting diode LD. Constitutions and operations of each pixel circuit 10 are described above with reference to FIGS. 1 through 4, duplicated descriptions will not be repeated.

The display panel 110 may be driven by a simultaneous (or concurrent) emission method. Thus, the pixel circuits 10 may concurrently emit light during the emission period. In one embodiment, each frame period may include the initialization period PI, the compensation period PC after the initialization period PI, the writing period PS after the compensation period PC, and the emission period PE after the writing period PS. The scan transistor T1 and the charge share transistor T4 may be turned on during the writing period PS. The organic light emitting diode LD may emit light during the emission period PE.

The scan driver 120 may provide the scan signals, the initialization signal, the emission control signal, and the charge share control signal to the pixel circuits 10 based on a first control signal CON1 received from the timing controller 150. The scan driver 120 may sequentially activate and provide the scan signals row by row in the writing period PI. The scan driver 120 may concurrently activate the initialization signals and concurrently provide the initialization signals to the pixel rows through the initialization lines IL1 to ILn during the initialization period PI. The scan driver 120 may concurrently activate the emission control signals and concurrently provide the emission control signals to the pixel rows through the emission control lines EL1 to ELn in the compensation period PC and the emission period PE. The scan driver 120 may activate the charge share control signals following the scan signals and may concurrently provide the charge share control signals to the pixel rows through the charge share control lines CSL1 to CSLn. In one embodiment, the scan driver 120 may include an initialization driver for outputting the initialization signals, an emission driver for outputting the emission control signals, and a charge share control driver for outputting the charge share control signals. The initialization signal, the emission control signal, and the charge share control signal may be global signals each concurrently activated with respect to all pixel rows.

The data driver 130 may generate data signals based on a second control signals CON2 and image data received from the timing controller 150. The data driver 130 may provide the data signals to the pixel circuits 10 through the data lines DL1 to DLm. The data signals may correspond to data voltages for displaying an image during the writing period PS. The data signals may correspond to a sustain voltage during other periods, except for the writing period PS in the frame period The power supply 140 may provide a first power supply voltage ELVDD, a second power supply voltage ELVSS less than the first power supply voltage ELVDD, and an initialization voltage VINIT to the pixel circuits 10 based on a third control signals CON3 received from the timing controller 150. The first and second power supply voltages ELVDD and ELVSS may be driving voltages for driving the display panel 110 (e.g., the pixel circuits 10). The initialization voltage VINIT may initialize a residue of voltage at the organic light emitting diode LD. The initialization voltage VINIT may be set at a sufficiently low voltage, considering a threshold voltage of the organic light emitting diode LD. In one embodiment, the initialization voltage VINIT may be less than or equal to the threshold voltage of the organic light emitting diode LD.

The timing controller 150 may control the scan driver 120, the data driver 130, and the power supply 140. The timing controller 150 may respectively provide the first through third control signals CON1 to CON3 to the scan driver 120, the data driver 130, and the power supply 140 and control the scan driver 120, the data driver 130, and the power supply 140.

Figure 6:
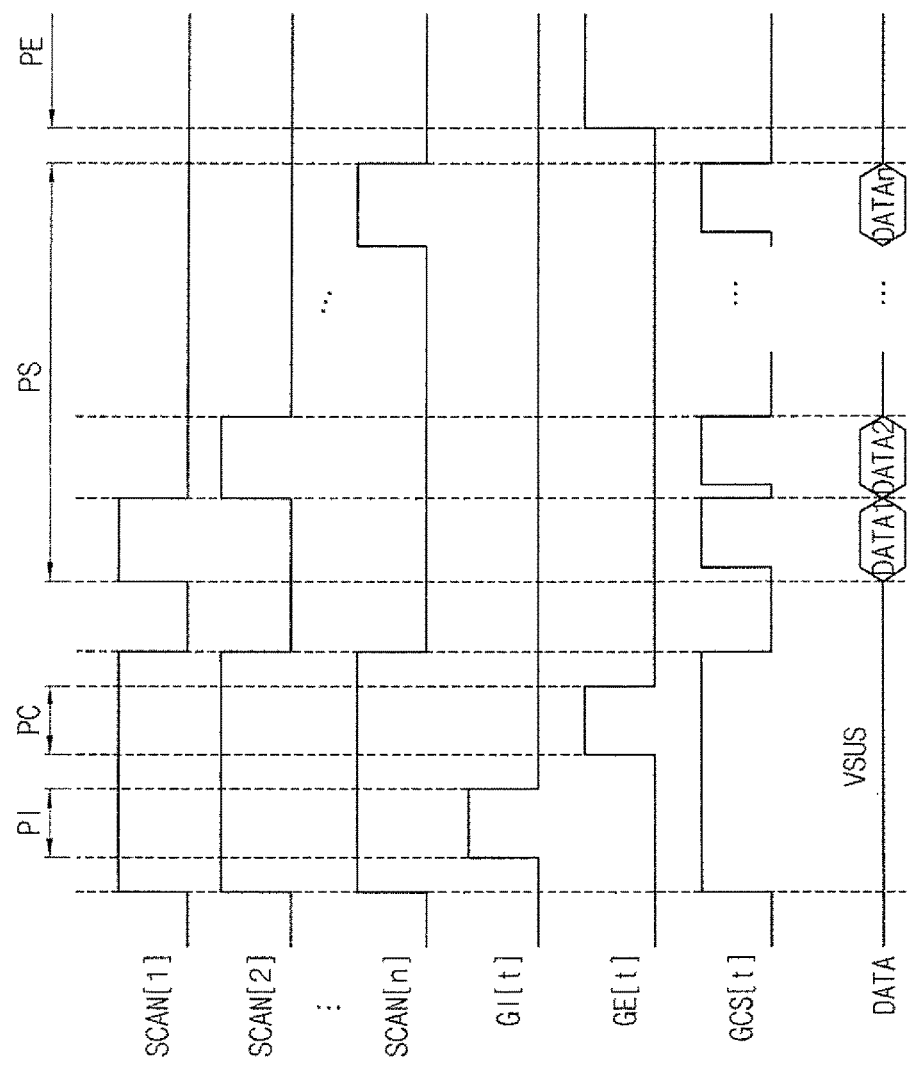
FIG. 6 is a timing diagram illustrating an example of an operation of the organic light emitting display device of FIG. 5.

FIG. 6 is a timing diagram illustrating an example of an operation of the organic light emitting display device of FIG. 5.

Referring to FIG. 6, each frame period may include an initialization period PI, a compensation period PC after the initialization period PI, a writing period PS after the compensation period PC, and an emission period PE after the writing period PS. The scan transistor T1 and the charge share transistor T4 may be turned on during the writing period PS. The organic light emitting diode LD may emit light during the emission period PE.

In one embodiment, the pixel circuit 10 may be driven by the simultaneous (or concurrent) emission method. Thus, the emission period PE may be started after the writing period PS with respect to all pixel rows elapsed.

A plurality of scan signals SCAN[1] through SCAN[n] may be concurrently activated with a logical high level during the initialization period PI and the compensation period PC. Accordingly, a charge share control signal GCS [t] may be activated with the logical high level during the initialization period PI and the compensation period PC. The charge share control signal GCS[t] may be a global signal that is concurrently provided to entire pixel rows. The charge share transistors T4 of the entire pixel circuits may maintain a turned-on state during the initialization period PI and the compensation period PC.

The initialization signal GI[t] may be activated with the logical high level during the initialization period PI, and the emission control signal GE[t] may be activated with the logical high level during the compensation period PC. The initialization signal GI[t] and the emission control signal GE[t] may be global signals that are concurrently provided to entire pixel rows, respectively.

The scan signals SCAN[1] through SCAN[n] may be sequentially activated with the logical high level during the writing period PS. Accordingly, a sequential scan operation from a first pixel row to an (n)-th pixel row may be performed. The charge share control signal GCS[t] may repeat the logical high and logical low levels depending on the scan signals SCAN[1] through SCAN[n] during the writing period PS. Here, the charge share transistor T4 may be turned on after the scan transistor T1 is turned on. The storage capacitor Cst and the charge share Ccs may be electrically connected in series with each other and the storage capacitor Cst and the charge share capacitor Ccs may share the electric charges. Thus, the luminance difference between the pixel circuits 10 due to the capacitive coupling between the parasitic capacitor Coled and the storage capacitor Cst may be reduced or eliminated.

The emission control signal GE[t] may be activated with the logical high level during the emission period PE such that the pixel circuits 10 may emit light. Accordingly, the emission period PE with respect to the entire pixel rows may be concurrently started after the writing period PS with respect to the entire pixel rows has elapsed.

Because operations of the pixel circuits 10 are described above with reference to FIGS. 1 and 2, duplicated descriptions will not be repeated.

Accordingly, the organic light emitting display device 100 may include the pixel circuits 10 having the charge share transistor T4 and the charge share capacitor Ccs connected to the storage capacitor Cst, such that the luminance differences of the display panel 110 by the capacitive coupling between the parasitic capacitor Coled and the storage capacitor Cst may be reduced or eliminated, and thus, the image uniformity (and the luminance uniformity) may be improved (e.g., increased).

Figure 7:
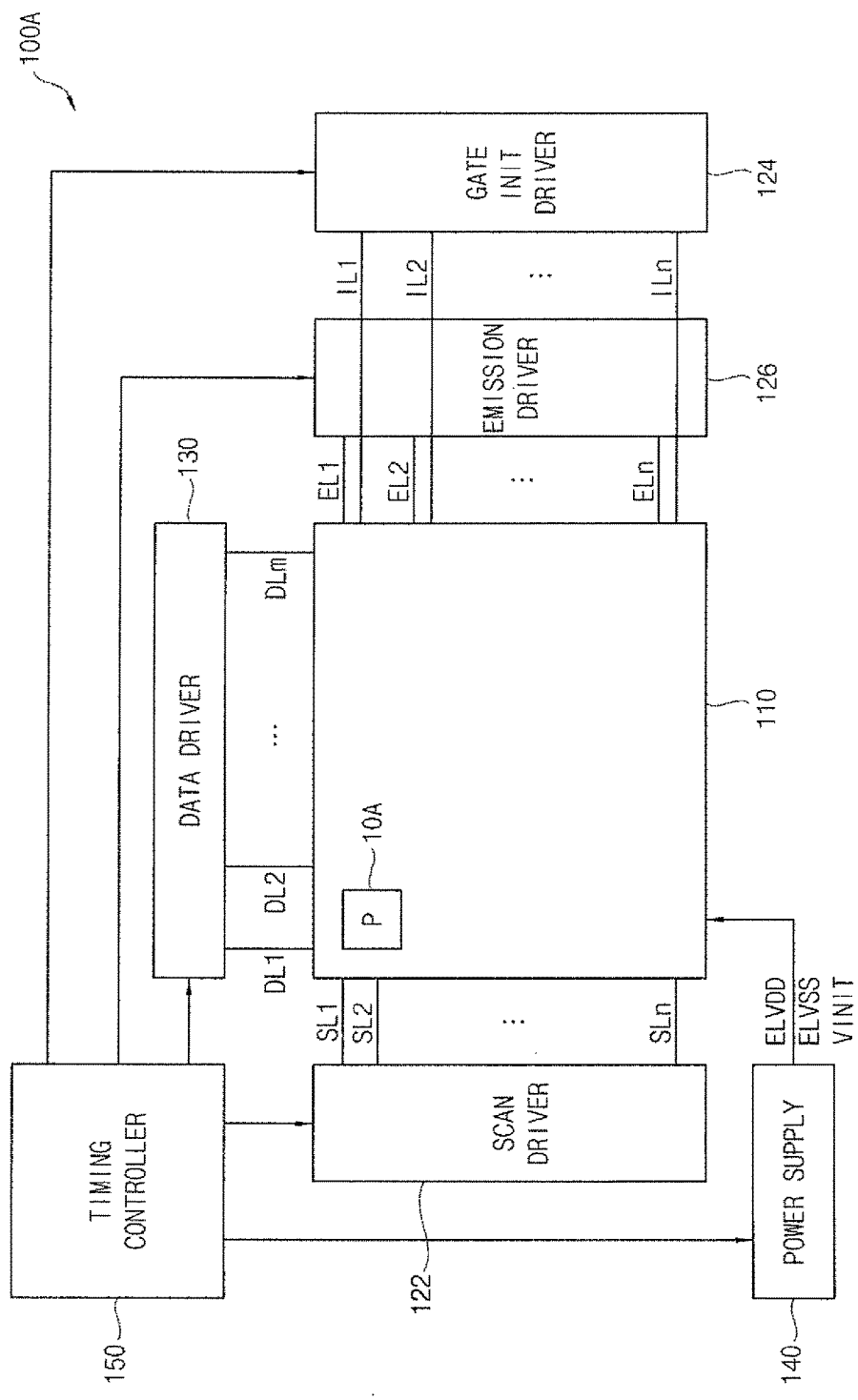
FIG. 7 is a block diagram illustrating an example of the organic light emitting display device of FIG. 5.
Figure 8:
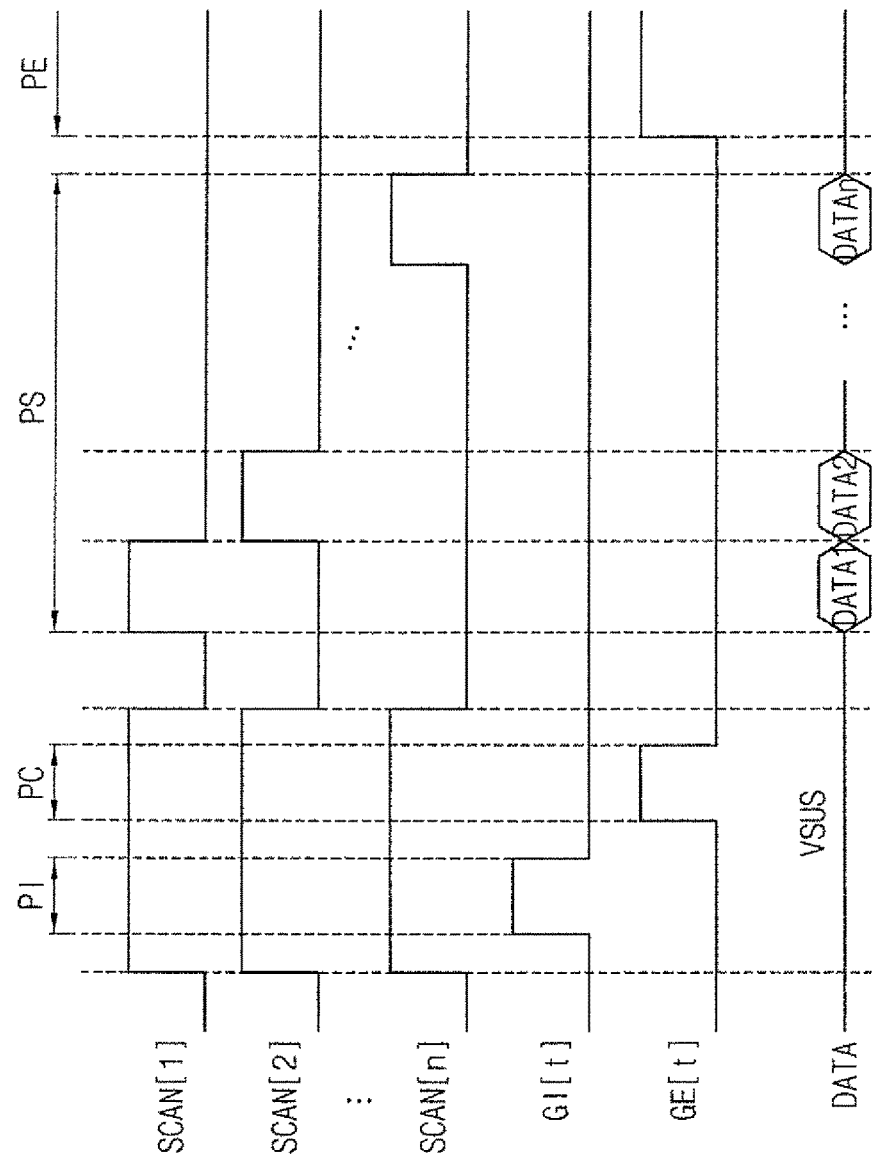
FIG. 8 is a timing diagram illustrating an example of an operation of the organic light emitting display device of FIG. 7.

FIG. 7 is a block diagram illustrating an example of the organic light emitting display device of FIG. 5. FIG. 8 is a timing diagram illustrating an example of an operation of the organic light emitting display device of FIG. 7.

In FIGS. 7 and 8, like reference numerals are used to designate elements of the organic light emitting display device that are the same as those in FIGS. 5 and 6, and detailed description of these elements may not be repeated. The organic light emitting display device of FIG. 7 may be substantially the same as or similar to the organic light emitting display device of FIG. 5, except for a signal provided to the charge share transistor T4.

Referring to FIGS. 7 and 8, the organic light emitting display device 100A may include a display panel 110, a scan driver 120, a data driver 130, a power supply 140, and a timing controller 150.

The display panel 110 may include a plurality of pixel circuits 10A of FIG. 3. The data driver 130 may provide data signals to the pixel circuits 10A through a plurality of data lines DL1 to DLm. The power supply 140 may provide a first power supply voltage ELVDD, a second power supply voltage ELVSS less than the first power supply voltage ELVDD, and an initialization voltage VINIT to the pixel circuits 10A. The timing controller 150 may control the scan driver 120, the data driver 130, and the power supply 140.

The scan driver 122 may provide the scan signals, the initialization signal, the emission control signal, and the charge share control signal to the pixel circuits 10A. In one embodiment, the scan driver 122 may include an initialization driver 124 for generating an initialization signal and an emission driver 126 for generating an emission control signal. The scan driver 122 may sequentially activate and provide the scan signals row by row in the writing period PI.

The scan driver 122 may provide the scan signal to the scan transistor T1 and the charge share transistor T4 in each of the pixel circuits 10A. Thus, the charge share transistor T4 and the scan transistor T1 may be turned on/off at substantially the same time. As illustrated in FIG. 8, the scan signals SCAN[1] through SCAN[n] may be concurrently activated with a logical high level during the initialization period PI and the compensation period PC. The scan signals SCAN[1] through SCAN[n] may be sequentially activated with the logical high level during the writing period PS.

The initialization driver 124 may concurrently provide the initialization signal GI[t], which is activated with the logical high level, to the pixel circuits 10A (e.g., to the pixel rows) during the initialization period PI. Thus, the initialization voltage VINIT may be applied to an anode of the organic light emitting diode LD such that a voltage of the organic light emitting diode LD may be initialized.

The emission driver 126 may concurrently provide the emission control signal GE[t], which is activated with the logical high level, to the pixel circuits 10A (e.g., to the pixel rows) during the compensation period PC. Thus, a threshold voltage compensating operation of the driving transistor TD of the entire pixel circuits 10A may be concurrently performed.

The scan signals SCAN[1] through SCAN[n] may be sequentially activated with the logical high level during the writing period PS. The charge share transistor T4 may be turned on after the scan transistor T1 is turned on. The storage capacitor Cst and the charge share Ccs may be electrically connected in series with each other and the storage capacitor Cst and the charge share capacitor Ccs may share the electric charges. Thus, the luminance difference between the pixel circuits 10A due to the capacitive coupling between the parasitic capacitor Coled and the storage capacitor Cst may be reduced or eliminated.

The emission control signal GE[t] may be activated with the logical high level during the emission period PE such that the pixel circuits 10A may emit light.

Accordingly, the organic light emitting display device 100A may include the pixel circuits 10A having the charge share transistor T4 and the charge share capacitor Ccs connected to the storage capacitor Cst, such that the luminance differences of the display panel 110 by the capacitive coupling between the parasitic capacitor Coled and the storage capacitor Cst may be reduced or eliminated, and thus, the image uniformity (and the luminance uniformity) may be improved (e.g., increased). In addition, the scan signal is applied to the charge share transistor T4 such that circuit constitutions for generating a charge share control of FIGS. 1 and 2 may be omitted (or may not be used). Thus, constitutions of a scan driver and/or a power supply may be simplified.

Figure 9:
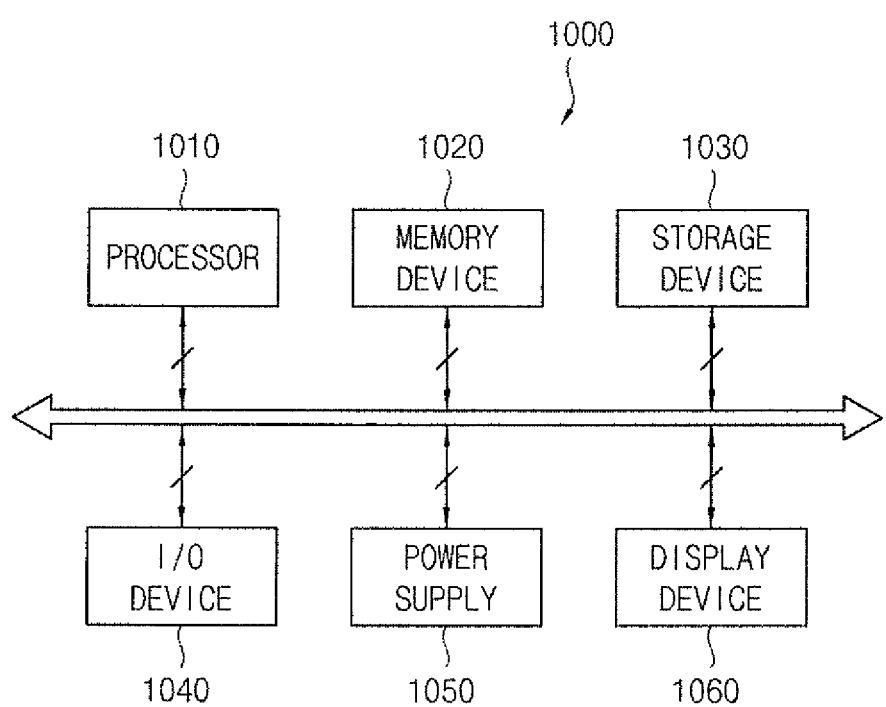
FIG. 9 is a block diagram of an electronic device according to example embodiments of the present invention.
Figure 10A:
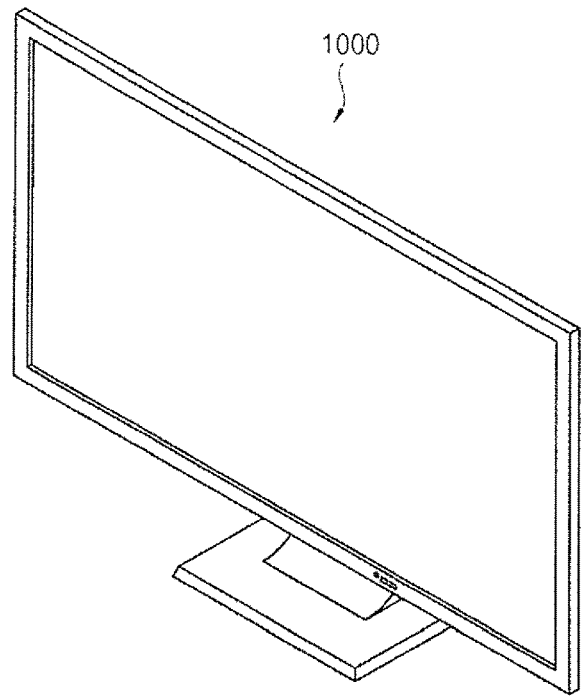
FIG. 10A is a diagram illustrating an example of the electronic device implemented as a television, according to example embodiments of the present invention.
Figure 10B:
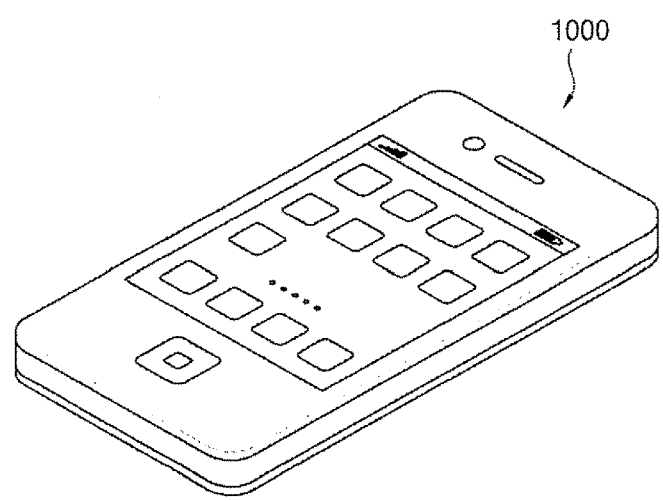
FIG. 10B is a diagram illustrating an example of the electronic device implemented as a smart phone, according to example embodiments of the present invention.

FIG. 9 is a block diagram of an electronic device according to example embodiments of the present invention. FIG. 10A is a diagram illustrating an example of the electronic device implemented as a television, according to example embodiments of the present invention. FIG. 10B is a diagram illustrating an example of the electronic device implemented as a smart phone, according to example embodiments of the present invention.

Referring to FIGS. 9 through 10B, the electronic device 1000 may include a processor 1010, a memory device 1020, a storage device 1030, an input/output (I/O) device 1040, a power supply 1050, and an organic light emitting display device 1060. Here, the organic light emitting display device 1060 may correspond to the organic light emitting display device of FIG. 5 or FIG. 7. In addition, the electronic device 1000 may further include a plurality of ports for communicating with a video card, a sound card, a memory card, a universal serial bus (USB) device, other suitable electronic devices, and/or the like. In one embodiment, as illustrated in FIG. 10A, the electronic device 1000 may be implemented in a television. In one embodiment, as illustrated in FIG. 10B, the electronic device 1000 may be implemented in a smart phone. However, these are examples and the electronic device 1000 is not limited thereto. For example, the electronic device 1000 may be implemented in a cellular phone, a video phone, a smart pad, a smart watch, a tablet, a personal computer, a navigation for vehicle, a monitor, a notebook, a head mounted display (HMD), and/or the like.

The processor 1010 may perform various suitable computing functions. The processor 1010 may be a microprocessor, a central processing unit (CPU), and/or the like. The processor 1010 may be coupled to other suitable components via an address bus, a control bus, a data bus, and/or the like. Furthermore, the processor 1010 may be coupled to an extended bus, such as a peripheral component interconnection (PCI) bus.

The memory device 1020 may also store data for operations of the electronic device 1000. For example, the memory device 1020 may include at least one non-volatile memory device, such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device, such as a dynamic random access memory (DRAM) device, a static random access memory (SRAM) device, a mobile DRAM device, and/or the like.

The storage device 1030 may store data for operations of the electronic device 1000. The storage device 1030 may be a solid state drive (SSD) device, a hard disk drive (HDD) device, a CD-ROM device, and/or the like.

The I/O device 1040 may be an input device, such as a keyboard, a keypad, a touchpad, a touch-screen, a mouse, and/or the like, and an output device, such as a printer, a speaker, and/or the like.

The power supply 1050 may provide power for operating the electronic device 1000.

The organic light emitting display device 1060 may be connected to other elements via the buses or other communication links. According to some example embodiments, the organic light emitting display device 1060 may be included in the I/O device 1040. As described above, the organic light emitting display device 1060 may include a display panel having a plurality of pixel circuits, a data driver for providing data signals to the display panel, a scan driver for providing a scan signal, an initialization signal, an emission control signal, and a charge share control signal to the display panel, and a timing controller for controlling the data driver and the scan driver.

Each of the pixel circuits in the display panel may include a charge share transistor, which is controlled by the charge share control signal, and a charge share capacitor, which performs electric charge sharing with a storage capacitor based on an operation of the charge share transistor. Thus, luminance difference between the pixel circuits 10 due to the capacitive coupling between the parasitic capacitor Coled and the storage capacitor Cst may be reduced or eliminated, and thus the image uniformity (and the luminance uniformity) may be improved (e.g., increased).

The present embodiments may be applied to any display device and any system including the display device. For example, the present embodiments may be applied to a television (TV), a digital TV, a 3D TV, a computer monitor, a laptop, a digital camera, a cellular phone, a smart phone, a smart pad, a personal digital assistant (PDA), a portable multimedia player (PMP), a MP3 player, a navigation system, a game console, a video phone, and/or the like.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

It will be understood that when an element is referred to as being "between" two elements or nodes, it can be the only layer between the two elements or nodes, or one or more intervening elements may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "connected to" or "coupled to" another element, it can be directly connected to or coupled to the other element, or one or more intervening elements may be present. When an element or layer is referred to as being "directly connected to" or "directly coupled to" another element, there are no intervening elements.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The display device and/or any other relevant devices or components, such as the pixel circuit, the timing controller, the scan, data, and emission drivers, gate initialization driver, according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined by the claims and equivalents thereof. In the claims, means-plus-function clauses are intended to cover the structures described herein as performing the recited function and also equivalent structures. Therefore, it is to be understood that the foregoing is illustrative of example embodiments and is not to be construed as limited to the specific embodiments disclosed, and that suitable modifications to the disclosed example embodiments, as well as other example embodiments, are intended to be included within the scope of the inventive concept, which is defined by the following claims, with equivalents of the claims to be included therein.

What is claimed is:

1. A pixel circuit comprising:
    a scan transistor connected between a data line and a first node and having a gate electrode configured to receive a scan signal;
    an emission control transistor connected between a first power supply and a second node and having a gate electrode configured to receive an emission control signal;
    a driving transistor connected between the second node and a third node and having a gate electrode connected to the first node;
    an initialize transistor connected between an initialization voltage supply and the third node and having a gate electrode configured to receive an initialization signal;
    a storage capacitor connected between the first node and the third node;
    an organic light emitting diode connected between the third node and a second power supply, a voltage of the second power supply being less than that of the first power supply;
    a charge share capacitor connected between a fourth node and the second power supply; and
    a charge share transistor connected between the third node and the fourth node and configured to connect the charge share capacitor to the storage capacitor, the charge share transistor having a gate electrode configured to receive a charge share control signal, wherein a capacitance of the charge share capacitor is greater than a parasitic capacitance of the organic light emitting diode.

2. The pixel circuit of claim 1, wherein the storage capacitor and the charge share capacitor are electrically connected in series with each other when the charge share transistor is turned on.

3. The pixel circuit of claim 1, wherein the capacitance of the charge share capacitor is less than or equal to a capacitance of the storage capacitor.

4. The pixel circuit of claim 1, wherein a voltage of the initialization voltage supply is less than or equal to a threshold voltage of the organic light emitting diode.

5. A pixel circuit comprising:
a scan transistor connected between a data line and a first node and having a gate electrode configured to receive a scan signal;
an emission control transistor connected between a first power supply and a second node and having a gate electrode configured to receive an emission control signal;
a driving transistor connected between the second node and a third node and having a gate electrode connected to the first node;
an initialize transistor connected between an initialization voltage supply and the third node and having a gate electrode configured to receive an initialization signal;
a storage capacitor connected between the first node and the third node;
an organic light emitting diode connected between the third node and a second power supply, a voltage of the second power supply being less than that of the first power supply;
a charge share capacitor connected between a fourth node and the second power supply; and
a charge share transistor connected between the third node and the fourth node and configured to connect the charge share capacitor to the storage capacitor, the charge share transistor having a gate electrode configured to receive a charge share control signal,
wherein each frame period comprises an initialization period, a compensation period after the initialization period, a writing period after the compensation period, and an emission period after the writing period, wherein the scan transistor and the charge share transistor are configured to be turned on during the writing period, and wherein the organic light emitting diode is configured to emit light during the emission period.

6. The pixel circuit of claim 5, wherein the charge share capacitor shares electric charges stored at the storage capacitor during the writing period.

7. The pixel circuit of claim 5, wherein the charge share transistor is configured to be turned on following the scan transistor being turned on in the writing period.

8. The pixel circuit of claim 5, wherein the charge share transistor is configured to maintain a turned-on state during the initialization period and the compensation period.

9. The pixel circuit of claim 5, wherein the charge share control signal corresponds to the scan signal.

10. The pixel circuit of claim 9, wherein the charge share transistor and the scan transistor are configured to be concurrently turned on.

11. An organic light emitting display device comprising:
a display panel comprising a plurality of pixel circuits each comprising a storage capacitor, an organic light emitting diode, and a charge share capacitor, a capacitance of the charge share capacitor being greater than a parasitic capacitance of the organic light emitting diode;
a data driver configured to provide data signals to the display panel;
a scan driver configured to provide a plurality of scan signals, an initialization signal, an emission control signal, and an charge share control signal to the display panel;
a power supply configured to provide a first power supply voltage, a second power supply voltage less than the first power supply voltage, and an initialization voltage to the display panel; and
a timing controller configured to control the data driver and the scan driver,
wherein each of the pixel circuits is configured to electrically connect the storage capacitor to the charge share capacitor during a writing period.

12. The device of claim 11, wherein each of the pixel circuits further comprises:
a scan transistor connected between a data line and a first node and having a gate electrode configured to receive a respective scan signal of the scan signals;
an emission control transistor connected between a line supplying the first power supply voltage and a second node, and having a gate electrode configured to receive the emission control signal;
a driving transistor connected between the second node and a third node and having a gate electrode connected to the first node;
an initialize transistor connected between a line supplying the initialization voltage and the third node, and having a gate electrode configured to receive the initialization signal;
the organic light emitting diode connected between the third node and a line supplying the second power supply voltage; and
a charge share transistor connected between the third node and a fourth node and configured to connect the charge share capacitor to the storage capacitor, the charge share transistor having a gate electrode configured to receive the charge share control signal,
wherein the storage capacitor is connected between the first node and the third node, and
wherein the charge share capacitor is connected between the fourth node and the line supplying the second power supply voltage.

13. The device of claim 12, wherein each frame period comprises an initialization period, a compensation period after the initialization period, a writing period after the compensation period, and an emission period after the writing period, wherein the scan transistor and the charge share transistor are configured to be turned on during the writing period, and wherein the organic light emitting diode is configured to emit light during the emission period.

14. The device of claim 13, wherein the scan driver is configured to sequentially activate the scan signals row by row in the writing period.

15. The device of claim 14, wherein the charge share control signal corresponds to the scan signals.

16. The device of claim 14, wherein the scan driver comprises:

an initialization driver configured to concurrently provide the initialization signal that is activated to the pixel circuits during the initialization period; and an emission driver configured to concurrently provide the emission control signal that is activated to the pixel circuits during the compensation period and the emission period.

17. The device of claim 16, wherein the scan driver further comprises:

a charge share driver configured to concurrently provide the charge share control signal that is activated according to the scans signals to the pixel circuits.

18. The device of claim 17, wherein the charge share transistor is configured to turn on following the scan transistor being turned on in the writing period.

19. The device of claim 17, wherein the charge share transistor is configured to maintain a turned-on state during the initialization period and the compensation period.

* * * * *